(12) United States Patent
Liang et al.

(10) Patent No.: US 9,876,184 B2
(45) Date of Patent: Jan. 23, 2018

(54) ORGANIC PHOTOSENSITIVE DEVICE WITH AN ELECTRON-BLOCKING AND HOLE-TRANSPORT LAYER

(71) Applicant: Taiwan Semiconductor Manufacturing Company, Ltd., Hsin-Chu (TW)

(72) Inventors: Chin-Wei Liang, Zhubei (TW); Hsing-Lien Lin, Hsin-Chu (TW); Cheng-Yuan Tsai, Hsin-Chu (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 12 days.

(21) Appl. No.: 14/012,692

(22) Filed: Aug. 28, 2013

(65) Prior Publication Data
US 2015/0060773 A1    Mar. 5, 2015

(51) Int. Cl.
*H01L 27/146* (2006.01)
*H01L 31/0256* (2006.01)
(Continued)

(52) U.S. Cl.
CPC ...... *H01L 51/4293* (2013.01); *H01L 51/4273* (2013.01); *H01L 51/0037* (2013.01);
(Continued)

(58) Field of Classification Search
CPC ....... Y02E 10/549; B82Y 20/00; B82Y 40/00; H01L 51/0043; H01L 2251/308;
(Continued)

(56) References Cited

U.S. PATENT DOCUMENTS 8,405,073 B2    3/2013  Ono et al.
2007/0069202 A1  3/2007  Choi et al.
(Continued)

FOREIGN PATENT DOCUMENTS

CN    102194996 B    1/2016
CN    102668153 A    9/2016
(Continued)

OTHER PUBLICATIONS

Yongye Liang et al. "For the Bright Future—Bulk Heterojunction Polymer Solar Cells with Power Conversion Efficiency of 7.4%", May 25, 2010, Advanced Materials vol. 22, Issue 20, pp. E135-E138.*

(Continued)

*Primary Examiner* — Seahvosh Nikmanesh
*Assistant Examiner* — Xiaoming Liu
(74) *Attorney, Agent, or Firm* — Haynes and Boone, LLP (57) ABSTRACT

The present disclosure provides a photosensitive device. The photosensitive device includes a donor-intermix-acceptor (PIN) structure. The PIN structure includes an organic hole transport layer; an organic electron transport layer; and an intermix layer sandwiched between the hole transport organic material layer and the electron transport organic material layer. The intermix layer includes a mixture of an n-type organic material and a p-type organic material.

20 Claims, 8 Drawing Sheets

(51) Int. Cl.
*H01L 51/42* (2006.01)
*H01L 51/00* (2006.01)

(52) U.S. Cl.
CPC .... *H01L 51/0038* (2013.01); *H01L 2251/306* (2013.01); *Y02E 10/549* (2013.01)

(58) Field of Classification Search
CPC ............ H01L 51/0037; H01L 51/0072; H01L 51/0071; H01L 51/5016; H01L 51/0046; H01L 51/42; H01L 51/4293; H01L 51/5012; C07D 285/14
See application file for complete search history.

(56) References Cited

U.S. PATENT DOCUMENTS

| 2007/0090371 | A1 | 4/2007 | Drechsel et al. | |
| 2009/0101891 | A1 | 4/2009 | Moon et al. | |
| 2010/0283039 | A1* | 11/2010 | Meng | B82Y 10/00 257/40 |
| 2011/0215406 | A1* | 9/2011 | Ono | H01L 51/10 257/347 |
| 2012/0199186 | A1* | 8/2012 | Okubo et al. | 136/255 |
| 2012/0211741 | A1* | 8/2012 | Kato et al. | 257/40 |
| 2012/0241003 | A1* | 9/2012 | Wachi | H01L 51/4246 136/263 |
| 2012/0312364 | A1* | 12/2012 | Uhrich et al. | 136/255 |
| 2013/0161596 | A1* | 6/2013 | Huang | H01L 51/44 257/40 |
| 2014/0175561 | A1 | 6/2014 | Colinge | |

FOREIGN PATENT DOCUMENTS

| KR | 20050116147 | 12/2005 |
| KR | 20070035341 | 3/2007 |
| KR | 20090040199 | 4/2009 |
| KR | 20110118459 | 10/2011 |
| KR | 20120065214 | 6/2012 |
| KR | 20130050082 A1 | 5/2013 |
| TW | 201240176 | 10/2012 |
| TW | 201312818 | 3/2013 |
| WO | WO-2012/111782 | 8/2012 |

OTHER PUBLICATIONS

Serap Günes et al., "Conjugated Polymer-Based Organic Solar Cells," Chem Rev. 2007, 2107, pp. 1324-1338, 2007 American Chemical Society, published on Web Apr. 11, 2007.
Daniela Baieri et al., "A Hybrid CMOS-imager with a Solution-Processable Polymer as Photoactive Layer," Nature Communications, 2012 Macmillan Publishers Limited, 8 pages.
T. Agostinelli, et al., "A Polymer/Fullerene Based Photodetector with Extremely Low Dark Current for X-Ray Medical Imaging Applications," Applied Physics Letters 93, 203305 (2008), Published by AIP Publishing LLC, 4 pages.
Taiwan Patent Office, Taiwanese Office Action dated May 12, 2015, for Application No. 10-2014-0098099, 10 pages, translation.
Korean Patent Office, Korean Office Action dated Mar. 31, 2016 for Application No. KR-10-2016-0019137, 11 pages.
Taiwan Patent Office, Taiwan Office Action dated Mar. 3, 2016 for Application No. 103120137, 7 pages.
Chinese Patent Office, Chinese Office Action dated Jul. 19, 2016, Application No. 2014103135655.5, 10 pages.

* cited by examiner

PCBM
(fullerene derivative)

|  | Voc (V) | Jsc (mA/cm2) | FF (%) | PCE (%) |
|---|---|---|---|---|
| w/o LiF | 0.60 | 8.78 | 60.8 | 3.11 |
| with LiF | 0.60 | 8.37 | 58.1 | 2.95 |
| With LiF and P3HT layer | 0.60 | 10.10 | 61.5 | 3.73 |

ORGANIC PHOTOSENSITIVE DEVICE WITH AN ELECTRON-BLOCKING AND HOLE-TRANSPORT LAYER

BACKGROUND

Image sensors are integrated circuit devices that include a plurality of sensor elements or pixels formed in a semiconductor substrate. The sensor elements are used for sensing a volume of exposed light projected towards the semiconductor substrate. For image sensors, a desire exists to advance quantum efficiency (QE) when pixel size is shrunk down. QE refers to the response with which the image sensor converts light to electrons within each pixel. Various techniques are used to form image sensors and to improve QE and sensitivity. For example, organic materials are used to form image sensors. However, in the existing image sensors with organic materials, existed are various issues that include high dark current and low power conversion efficiency.

Therefore, what is needed is a structure of an organic image sensor and a method making the same to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, that may benefit from the present invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

An organic photosensitive device and the method making the same are described below according to aspects of the present disclosure in various embodiments. The organic photosensitive device includes an imaging sensor (such as a photodiode) designed to sense light or an energy conversion device (such as solar cell) to receive light for electrical energy conversion.

Figure 1:
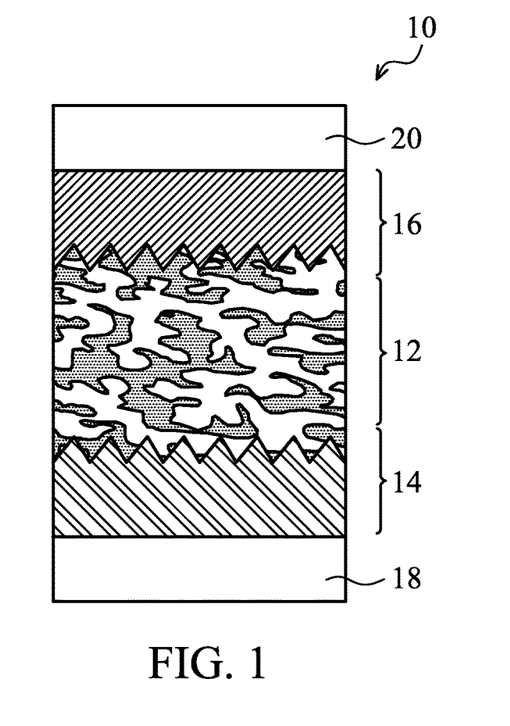
FIG. 1 illustrates a sectional view of a photosensitive device constructed according to aspects of the present disclosure.

Referring to FIG. 1, illustrated is a sectional view of a photosensitive device 10. In one embodiment, the photosensitive device 10 includes an imaging sensor, such as a photodiode. In another embodiment, the photosensitive device 10 includes a solar cell designed for electrical energy conversion from light. The photosensitive device 10 includes various organic materials configured to achieve its function and address various issues to enhance performance and quality. Therefore, the photosensitive device 10 is also referred to as organic photosensitive device. The photosensitive device 10 is formed on a substrate, such as a glass substrate, a semiconductor substrate or other suitable substrate. Various organic material layers may be disposed by a suitable technique, such as spin coating, knife-over-edge coating, spray coating, slot-die coating, rotogravure printing, screen printing or other suitable technique. Other materials (such as electrode materials) may be disposed by physical vapor deposition (PVD), plating or other suitable technique.

The photosensitive device 10 has a donor-intermix-acceptor (PIN) structure. Especially, the photosensitive device 10 includes a hole transport (p-type) layer 14 and an electron transport (n-type) layer 16. The photosensitive device 10 further includes an intermix layer 12 interposed between the hole transport layer 14 and the electron transport layer 16. The PIN structure is designed for photo sensing with further electron blocking and leakage reduction, thereby improving photocurrent and optical characteristics of the photosensitive device 10.

In one embodiment, the hole transport layer 14 includes an organic hole transport material and therefore is also referred to as an organic hole transport layer 14. In another embodiment, the electron transport layer 16 includes an organic electron transport material and therefore is referred to as an organic electron transport layer 16.

The intermix layer 12 functions as a photoactive layer of the photosensitive device 10. The intermix layer 12 includes an organic material, therefore is also referred to as organic photoactive layer. In the present embodiment, the intermix layer 12 includes a mixture (blending) of an organic hole transport (organic p-type) material and an organic electron transport (organic n-type) material. In another embodiment, the intermix layer 12 includes a mixture (blending) of an n-type fullerene derivative and a p-type conjugate polymer. In a particular embodiment, the intermix layer 12 includes a mixture of the organic hole transport material of the hole transport layer 14 and the organic electron transport material of the electron transport layer 16. The intermix layer 12 may have a uniform composition or alternatively has a gradient composition that varies from the hole transport layer 14 to the electron transport layer 16.

The hole transport layer 14 may include one or more hole transport materials and may include one or more films with respective hole transport materials. In one embodiment, the hole transport layer 14 includes a conjugate polymer to function for hole transport and further for electron blocking. In one example, the hole transport layer 14 includes Poly (3-hexylthiophene-2,5-diyl) (or P3HT). In another example, the hole transport layer 14 includes Poly(2-methoxy5-(3'-7'-dimethyloctyloxy)-1,4-phenylenevinylene (or MDMO-PPV).

In another embodiment, the hole transport layer 14 includes two films: a first p-type material film and a second p-type material film of a conjugated polymer (such as P3HT or MDMO-PPV) disposed on the first p-type material film. In one example, the first p-type material film includes poly(3,4-ethylenedioxythiophene) poly(styrenesulfonate) (or PEDOT:PSS). In an alternative example, the first p-type material film includes one of molybdenum oxide (MoO$_3$), nickel oxide (NiO), copper oxide (CuO), vanadium oxide (V$_2$O$_5$), tungsten oxide (WO$_3$) and a combination thereof.

The electron transport layer 16 may include one or more electron transport materials and may include one or more films with respective electron transport materials. In one embodiment, the electron transport layer 16 includes an n-type fullerene derivative to function for electron transport and hole blocking. In one example, the electron transport layer 16 includes Phenyl-C61-Butyric-Acid-Methyl Ester (or PCBM). In another example, the electron transport layer 16 may include phenyl-C70-butyric acid methyl ester (PC70BM), phenyl C71 butyric acid methyl-ester (PC71BM) or a combination thereof.

In another embodiment, the electron transport layer 16 includes two films: a first n-type material film of a fullerene derivative (such as PCBM) and a second n-type material film disposed on the first n-type material film. In one example, the second n-type material film includes lithium fluorine (LiF). Alternatively, the second n-type material film includes a material selected from the group consisting of LiF, calcium (Ca), magnesium (Mg), calcium oxide (CaO), magnesium oxide (MgO), aluminum oxide(Al$_2$O$_3$), or organic electron transport material layer such as bathocuproine (BCP), 1,3,4-Oxadiazole,2,2-(1,3-phenylene)bis[5-[4-(1,1-dimethylethyl)phenyl]] (or OXD-7). The formation of the electrodes may use a suitable technique, such as PVD.

Back to the intermix layer 12, the intermix layer 12 includes a mixture of the hole transport material of the hole transport layer 14 and the electron transport material of the electron transport layer 16 according to one embodiment. In one example, the intermix layer 12 includes a mixture of P3HT and PCBM (simply referred to as P3HT:PCBM).

In another embodiment, the intermix layer 12 includes a p-type material of a conjugated polymer and an n-type material of a fullerene derivative. For one example, the p-type material of a conjugated polymer includes Poly[[4,8-bis[(2-ethylhexyl)oxy]benzo[1,2-b:4,5-b']dithiophene-2,6-diyl] [3-fluoro-2-[(2-ethylhexyl)carbonyl] thieno[3,4-b] thiophenediyl]] (or PTB7). For another example, an n-type material of a fullerene derivative includes PC70BM or PC71BM. In one example, the intermix layer 12 includes a mixture (blend) of PTB7 and PC70BM, simply referred to as PTB7:PC70BM. In other embodiments, the intermix layer 12 includes various mixture of one or more p-type materials and one or more n-type materials.

The formation of the electron blocking layer 12 includes spin coating, spray coating, inkjet printing, thermal evaporated process or other suitable method.

The photosensitive device 10 further includes two electrodes configured on the two ends of the PIN structure. Particularly, the photosensitive device 10 includes an anode 18 adjacent the hole transport layer 14 and a cathode 20 adjacent the electron transport layer 16, as illustrated in FIG. 1. In one embodiment, the anode 18 includes a transparent conductive material, such as indium tin oxide (tin-doped indium oxide, or ITO). Alternatively, transparent conductive material may include aluminum-doped zinc oxide (AZO) or indium gallium zinc oxide (IGZO). The deposition of the transparent electrode may include PVD, pulsed laser deposition or other suitable deposition technique.

In another embodiment, the cathode 20 includes aluminum (Al). Alternatively, the cathode 20 includes a conductive material selected from the group consisting of Al, titanium (Ti), silver (Ag) or a combination thereof. The formation of various electrodes may use a suitable technique, such as PVD. The electrodes may be configured differently. For example, if the photosensitive device 10 is configured such that the light is directed to the photoactive layer from another sides (n-type layer), then the transparent conductive material may be used to form the cathode 20.

Different advantages may present in various embodiments of the photosensitive device 10. In one embodiment, the photosensitive device 10 includes P3HT inserted between the photoactive layer (such as P3HT:PCBM or PTB7:PC70BM) and a hole transport layer (such as PEDOT:PSS). P3HT functions as an electron blocking layer to reduce the leakage current. P3HT is essentially an outstanding donor material that can absorb light with 400-600 nm in wavelength and creates an extra donor/acceptor interface close to the bottom of the composite layers to enhance short circuit current density. P3HT as an inserted electron blocking layer substantially increases blocking electron capability to reduce dark current density. Alternatively, MDMO-PPV may be inserted between the photoactive layer (such as P3HT:PCBM or PTB7:PC70BM) and a hole transport layer (such as PEDOT:PSS), functioning as an electron blocking layer to reduce the leakage current. In furtherance of the embodiment, the electron transport layer may be eliminated from the photosensitive device 10.

Figure 2:
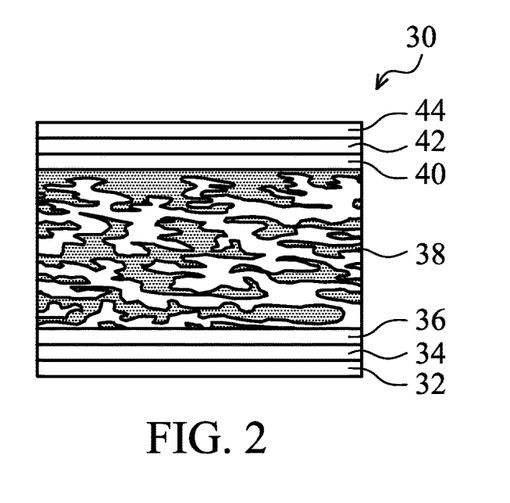
FIG. 2 illustrates a sectional view of a photosensitive device constructed according to aspects of the present disclosure in one or more embodiments.

FIG. 2 illustrates a sectional view a photosensitive device 30 constructed according to aspects of the present disclosure. The photosensitive device 30 may be one embodiment of the photosensitive device 10. In one embodiment, the photosensitive device 30 includes various organic materials configured to achieve its function with enhanced performance and quality. The photosensitive device 30 includes an electron blocking layer inserted between the hole transport layer and the photoactive layer.

The photosensitive device 30 is formed on a substrate, such as a semiconductor substrate or other suitable substrate (such as a glass substrate). Various organic material layers of the photosensitive device 30 may be formed by a suitable technique, such as spin coating, knife-over-edge coating, spray coating, slot-die coating, rotogravure printing, thermal evaporated process or screen printing.

The photosensitive device 30 includes an electrode 32. The electrode 32 includes a conductive material, such as titanium (Ti), titanium nitride (TiN), gold (Au), or silver (Ag). The deposition of the electrode 32 may include PVD, plating or other suitable deposition technique.

The photosensitive device 30 includes a hole transport and electron blocking layer 34 disposed on the electrode 32.

In various embodiments, the hole transport and electron blocking layer 34 includes PEDOT:PSS, or alternatively includes one of molybdenum oxide ($MoO_3$), nickel oxide (NiO), copper oxide (CuO), vanadium oxide ($V_2O_5$), tungsten oxide ($WO_3$) and a combination thereof.

The photosensitive device 30 includes an organic hole transport and electron blocking layer 36 disposed on the hole transport and electron blocking layer 34. In one embodiment, the organic hole transport and electron blocking layer 36 includes P3HT, MDMO-PPV or other organic electron blocking material.

The photosensitive device 30 includes an organic photoactive layer 38 disposed on the organic hole transport and electron blocking layer 36. The organic photoactive layer 38 may include a conjugated polymer, a fullerene derivative, or a combination thereof. In the present embodiment, the organic photoactive layer 38 includes one or more conjugated polymer and one or more fullerene derivative in mixture. The organic photoactive layer 38 may have a uniform composition or a graded composition with the concentrations of the conjugated polymer and the fullerene derivative varying from the bottom surface to the top surface. In one example, the organic photoactive layer 38 includes P3HT:PCBM. In another example, the organic photoactive layer 38 includes PTB7:PC70BM. In yet another embodiment, the organic photoactive layer 38 includes a mixture of one or more fullerene derivative (PCBM, PC71BM, or PC71BM) and one more conjugated polymer (P3HT, or PTB7).

In one embodiment of the organic photoactive layer 38 that includes PTB7:PC71BM blending and the organic hole transport and electron blocking layer includes H3HT, the photoactive layer has a high external quantum efficiency (EQE) (>60%) and an adjustable optical characteristics due to the maximum absorption range. Particularly, the absorption ranges of PC71BM, P3HT, and PTB7 are at 450 nm, 550 nm and 650 nm, respectively.

The photosensitive device 30 includes an organic electron transport and hole blocking layer 40 disposed on the organic photoactive layer 38. In one embodiment, the organic electron transport and hole blocking layer 40 includes fullerene derivative, n-type conjugated polymer or combination thereof. The organic electron transport and hole blocking layer 40 may include one or more material, such as a combination of a fullerene derivative and an n-type conjugated polymer. The organic electron transport and hole blocking layer 40 may include one or more films each with respective electron transport material. In one example, the organic electron transport and hole blocking layer 40 includes PCBM.

The photosensitive device 30 includes an electron transport and hole blocking layer 42 disposed on the organic electron transport and hole blocking layer 40. The electron transport and hole blocking layer 42 includes lithium fluorine (LiF), titanium oxide ($TiO_2$), zinc oxide (ZnO), tantalum oxide ($Ta_2O_5$), zirconium oxide ($ZrO_2$) or a combination thereof. The formation of the electron transport and hole blocking layer 34 may include PVD, chemical vapor deposition (CVD) or other suitable deposition technique.

The photosensitive device 30 includes a transparent electrode 44 disposed on the electron transport and hole blocking layer 42. The transparent electrode 44 includes a conductive material that is transparent to the light to be sensed by the photosensitive device 30 during the applications. In one example, the transparent electrode 44 includes ITO. In other example, the transparent electrode 44 includes aluminum-doped zinc oxide (AZO) or indium gallium zinc oxide (IGZO). The deposition of the transparent electrode may include PVD, pulsed laser deposition or other suitable deposition technique.

Figure 3:
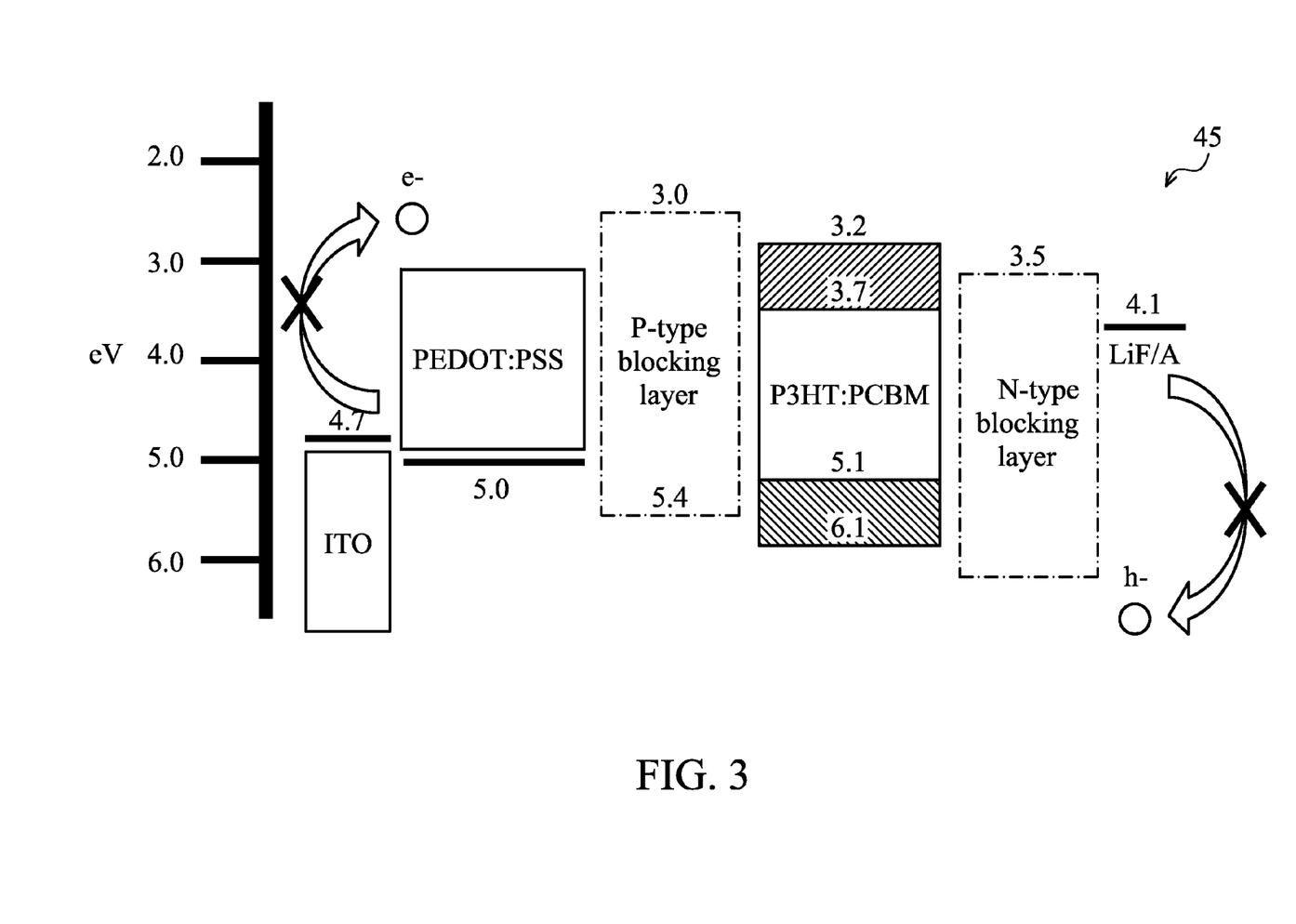
FIG. 3 illustrates a diagrammatical view of a photosensitive device constructed according to aspects of the present disclosure in one or more embodiments.

FIG. 3 illustrates a photosensitive device 45 with various materials of respective energy band structures in diagrammatical view. Various energy levels are labeled in FIG. 3 in unit eV. The photosensitive device 45 may be one example of the photosensitive device 30. The photosensitive device 45 includes an electron blocking layer inserted between the hole transport layer and the photoactive layer. Particularly, the photosensitive device 45 includes an electrode of an ITO layer, a hole transport layer of PEDOT:PSS, a p-type blocking layer, an organic photoactive layer of P3HT:PCBM, a n-type blocking layer, a LiF and an electrode of an Al layer sequentially configured as illustrated in FIG. 3. Alternatively, the organic photoactive layer may include PTB7:PC70BM.

Figure 4:
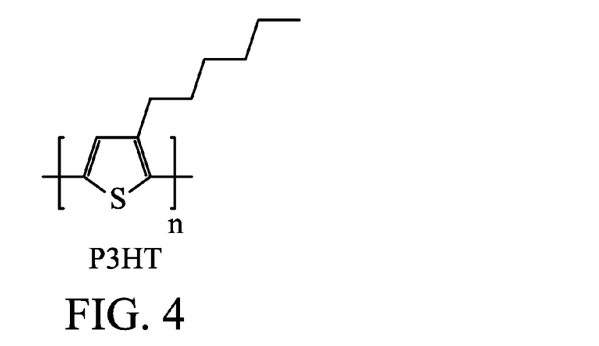
FIGS. 4, 5 and 6 are diagrammatical views of various chemicals of the photosensitive device in FIG. 3.

The p-type electron blocking layer includes a conjugated polymer. In one embodiment, the p-type electron blocking layer includes P3HT as illustrated in FIG. 4. P3HT is inserted between the hole transport layer of PEDOT:PSS and the organic photoactive layer. P3HT can absorb light with 400-600 nm in wavelength and creates an extra donor/acceptor interface to enhance short circuit current density. P3HT as an inserted electron blocking layer substantially increases blocking electron capability to reduce dark current density.

Figure 5:
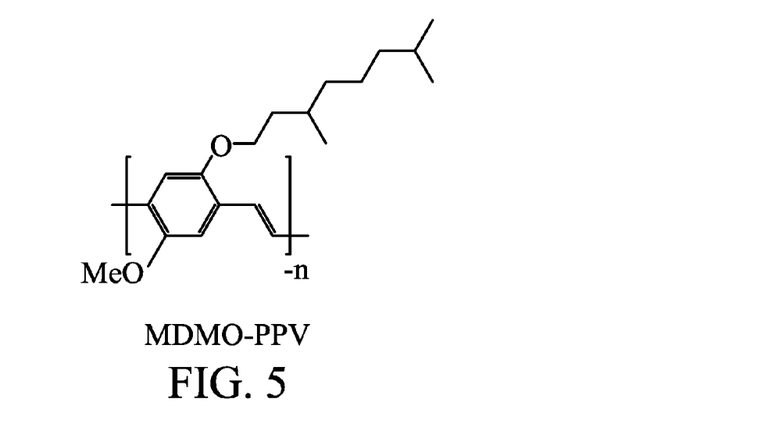

In another embodiment, the p-type electron blocking layer includes MDMO-PPV as illustrated in FIG. 5. MDMO-PPV functions as an electron blocking layer to reduce the leakage current. In a particular example, MDMO-PPV is inserted between the hole transport layer of PEDOT:PSS and the photo active layer of P3HT:PCBM.

The p-type electron blocking layer of a conjugated polymer provides a proper structure to effectively block electron and reduce the leakage. The energy bandgap (or bandgap) of the electron blocking layer is defined as bandgap=|HOMO−LUMO|, where HOMO is the highest occupied molecular orbital of the conjugated polymer and LUMO is the lowest unoccupied molecular orbital of the conjugated polymer. In the present embodiment, HOMO ranges between 5 eV and 5.4 eV, LUMO ranges between 2.8 eV and 3.2 eV, and the bandgap ranges between 2 eV and 2.4 eV. In the first example where P3HT is used as the p-type electron blocking layer, HOMO=5 eV, LUMO=3 eV and bandgap=2 eV. In the second example where MDMO-PVV is used as the p-type electron blocking layer, HOMO=5.4 eV, LUMO=3.0 eV and bandgap=2.4 eV.

Figure 6:
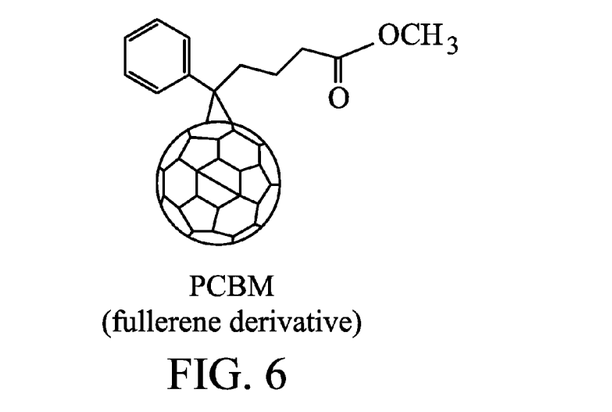

The n-type electron blocking layer includes a fullerene derivative. In one embodiment, the n-type electron blocking layer includes PCBM as illustrated in FIG. 6. The n-type electron blocking layer of a fullerene derivative provides a proper structure to effectively block electron and reduce the leakage. The energy bandgap (or bandgap) of the n-type electron blocking layer is defined as bandgap=|HOMO−LUMO|, where HOMO is the highest occupied molecular orbital of the fullerene derivative and LUMO is the lowest unoccupied molecular orbital of the fullerene derivative. In the present embodiment, HOMO ranges between 6.1 eV and 6.7 eV, LUMO ranges between 3.2 eV and 4.5 eV, while the bandgap ranges between 1.6 eV and 3.0 eV. In the present embodiment where PCBM is used as the n-type electron blocking layer, HOMO=6.1 eV, LUMO=3.7 eV and bandgap=2.4 eV.

Due to respective energy levels of the various materials, the electrons from ITO are blocked from entering to the organic photoactive layer by the p-type electron blocking layer of the conjugated polymer, and the holes from Al are blocked from entering the organic photoactive layer by the n-type electron blocking layer of the fullerene derivative, effectively reducing the current leakage.

Figure 7:
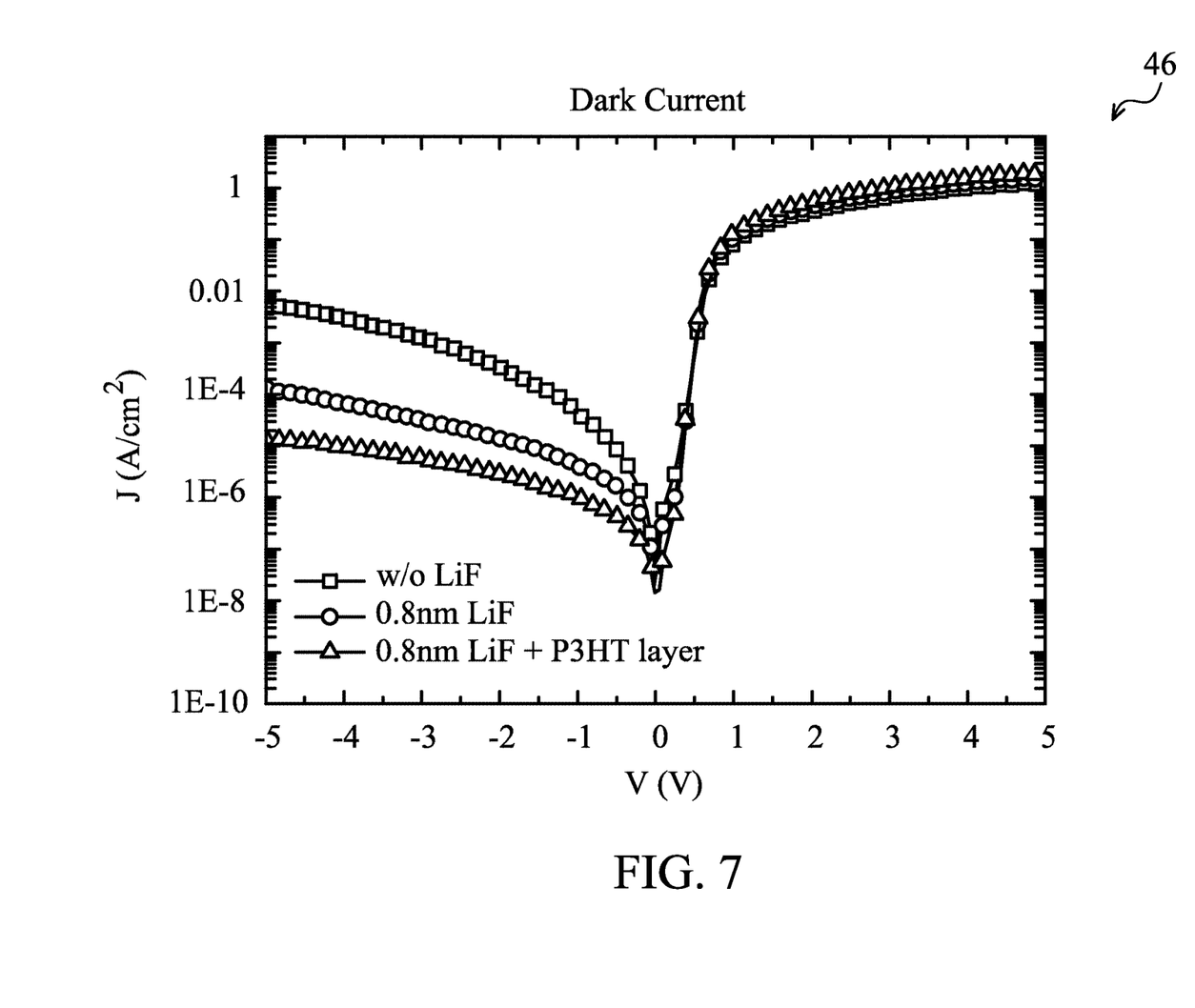
FIG. 7 illustrates a diagrammatical view of dark currents of various photosensitive devices constructed according to aspects of the present disclosure in various examples.
Figure 8:
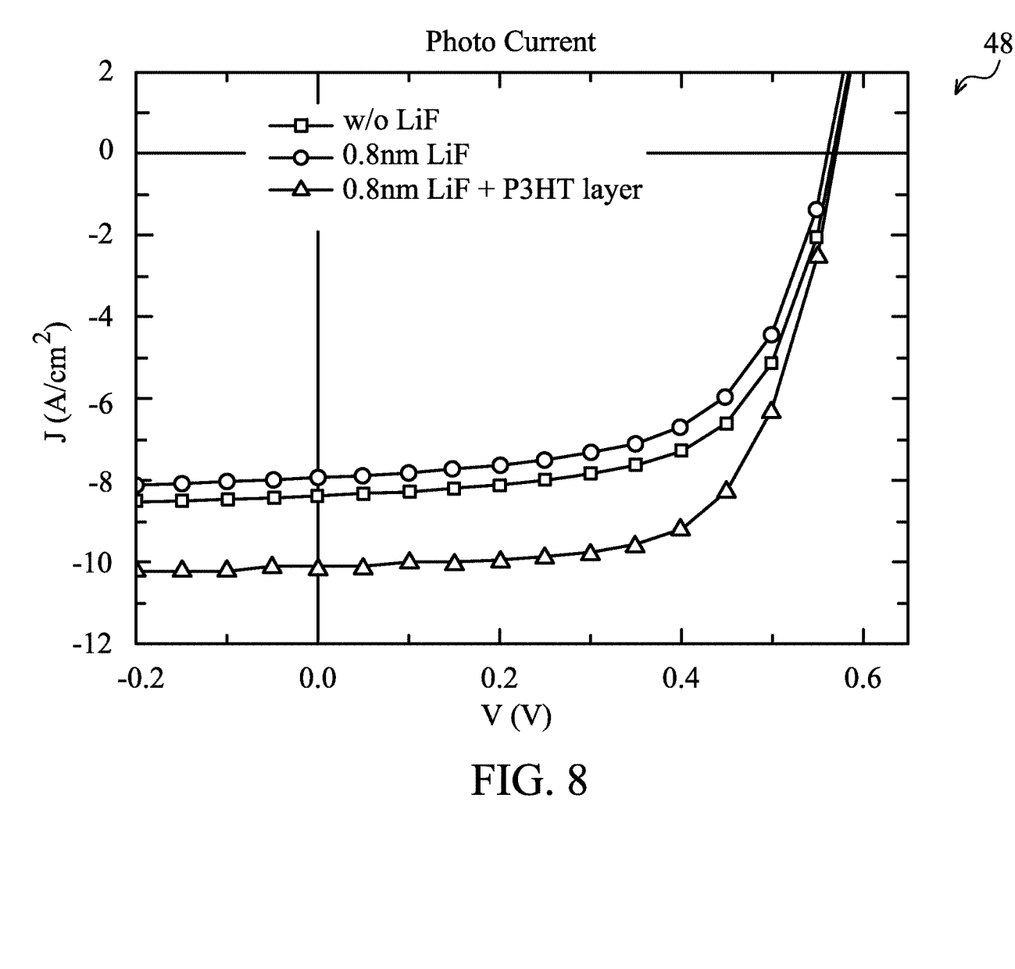
FIG. 8 illustrates a diagrammatical view of photo current of the various photosensitive devices constructed according to aspects of the present disclosure in various examples.
Figure 9:
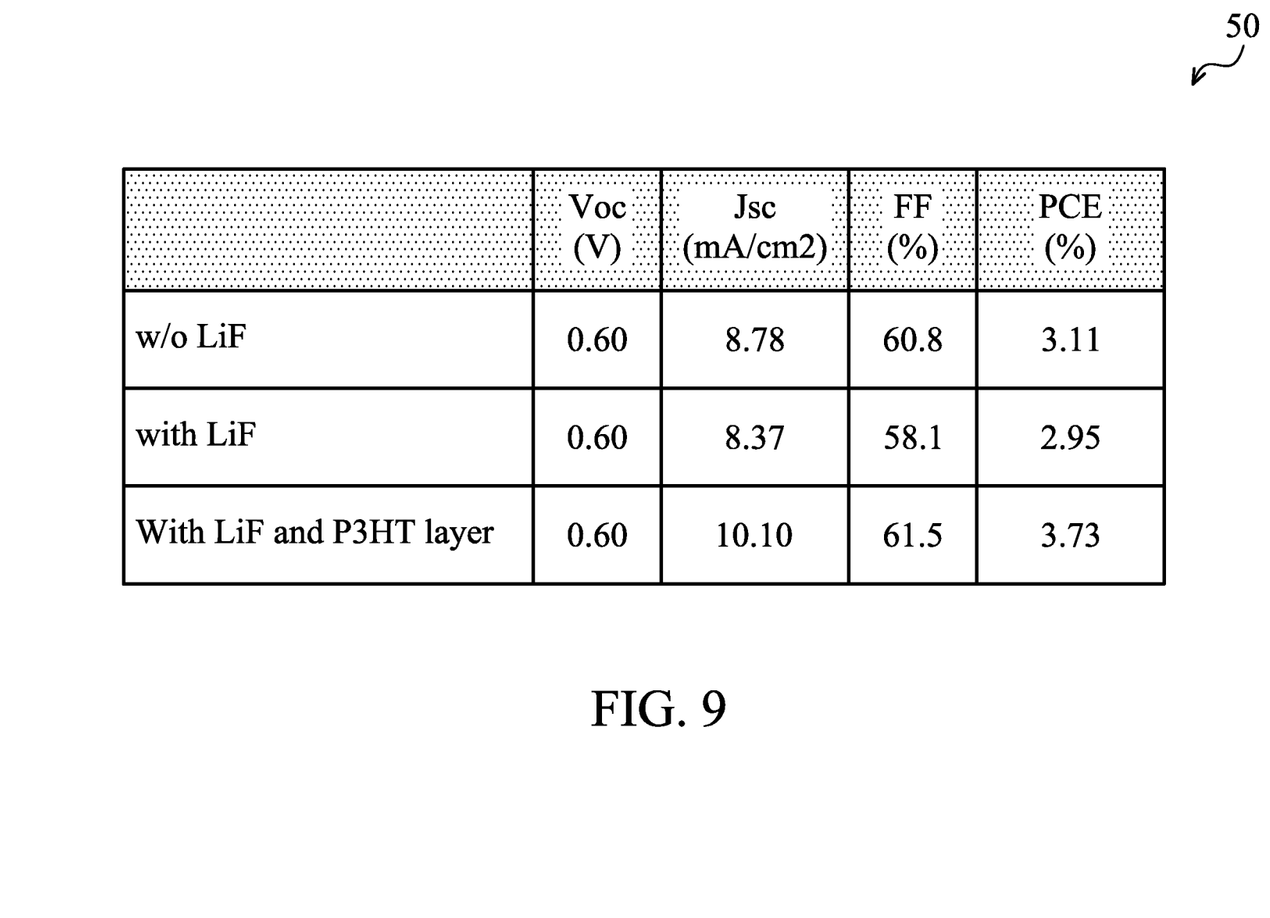
FIG. 9 is a table of diagrammatical view of characteristic data of the various photosensitive devices constructed according to aspects of the present disclosure in various examples.

FIGS. 7-9 are characteristic data of various photosensitive devices including a photosensitive device 45. FIG. 7 illustrates the dark currents 46 of the various photosensitive devices in a diagrammatical view. FIG. 8 illustrates the photo currents 48 of the various photosensitive devices in a diagrammatical view. FIG. 9 is a table 50 that lists parameters and configurations of the various photosensitive devices.

Particularly, the various photosensitive devices associated with FIGS. 7-9 include a first photosensitive device, a second photosensitive device, and a third photosensitive device that is one example of the photosensitive device 45. Compare to the third photosensitive device, the first photosensitive device does not include the hole blocking layer of LiF. The second photosensitive device includes LiF as a hole blocking layer (with a thickness of 0.8 nm in this example).

In FIG. 7, the horizontal axis is the voltage "V" (in volts or V) applied to the photosensitive device, and the vertical axis is the current density "J" (in $A/cm^2$) through the photosensitive device. The data are collected from the first, second and third photosensitive devices, respectively. Particularly, the photosensitive device 45 in the present example includes the electron blocking layer of P3HT and further includes a hole blocking layer of LiF. It is illustrated that the dark current of the photosensitive device 45 is reduced compared to other photosensitive devices.

In FIG. 8, the horizontal axis is the voltage "V" (in volts or V) applied to the photosensitive device, and the vertical axis is the current density "J" (in $mA/cm^2$) through the photosensitive device. The data are collected from the first, second and third photosensitive devices, respectively. It is illustrated that the amplitude of the photo current of the photosensitive device 45 is increased compared to other photosensitive devices.

In the table 50 of FIG. 9, the first, second and third photosensitive devices are noted as "w/o LiF", "with LiF" and "with LiF and P3HT layer", respectively. The various parameters include the open-circuit voltage "$V_{oc}$" in V, the short circuit current "$J_{sc}$" in mA/cm2, the fill factor "FF" in % and the power conversion efficiency "PCE" in %. The data in the table 50 further illustrate the improved performance of the photosensitive device 45 compared to other photosensitive devices.

Figure 10:
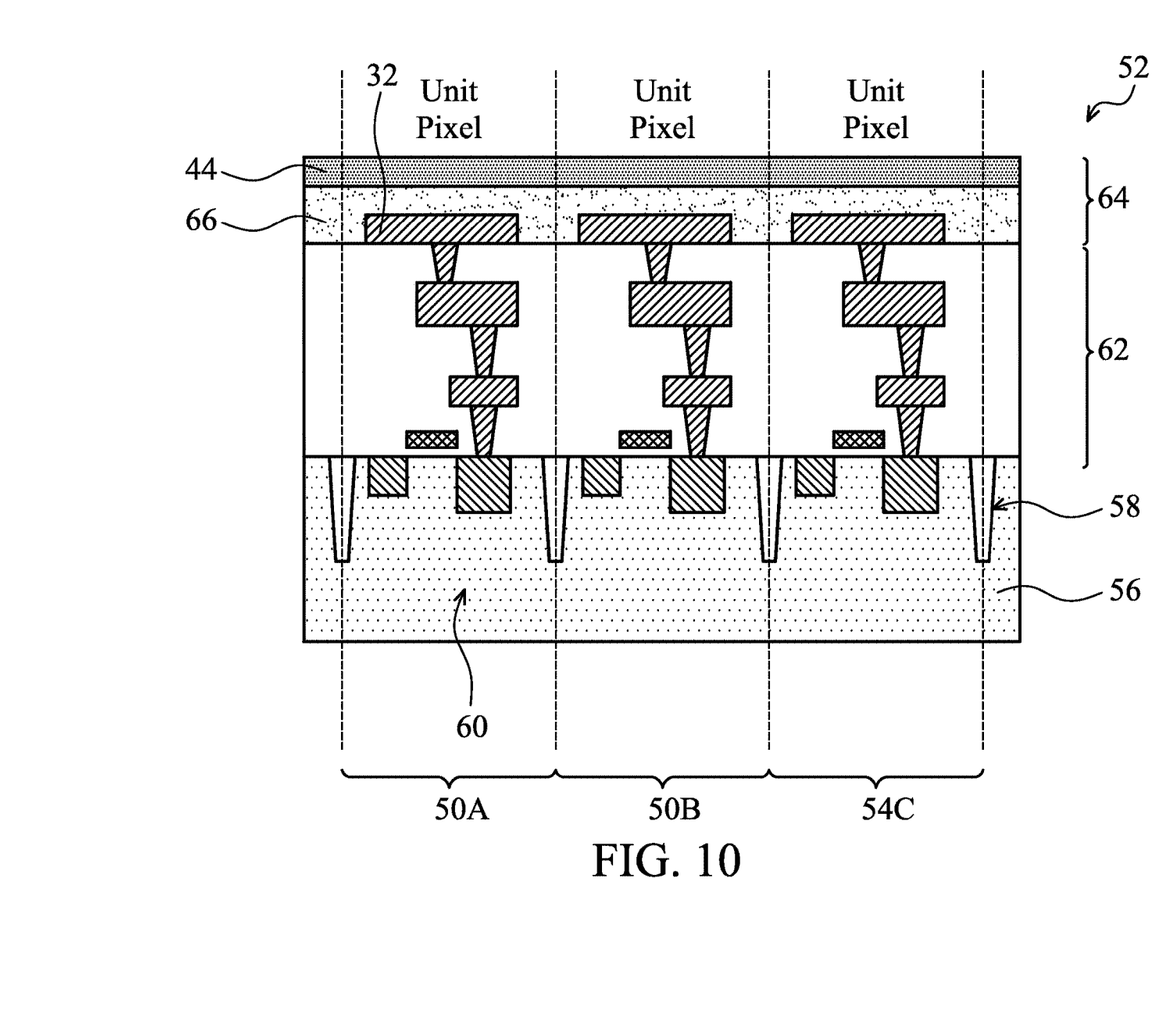
FIG. 10 illustrates a sectional view of a photosensitive structure constructed according to aspects of the present disclosure in one embodiment.

FIG. 10 is a sectional view of a photosensitive structure 52 having a plurality of photosensitive devices (such as photosensitive devices 10, 30 or 45) integrated in an array. In the present example for illustration, the photosensitive structure 52 includes three exemplary unit pixels 54 (54A, 54B and 54C). Each unit pixel includes a photosensitive device.

The photosensitive structure 52 includes a substrate 56. The substrate 56 includes silicon, such as crystalline silicon. The substrate 56 may alternatively or additionally include other semiconductor material such as germanium, gallium arsenic, or indium phosphide. The substrate 56 may include various p-type doped regions and/or n-type doped regions configured and coupled to form various devices and functional features. All doping features may be achieved using a process such as ion implantation or diffusion in various steps and techniques.

The photosensitive structure 52 may further includes various isolation features 58 formed in the substrate 56. In one example, the isolation features 58 include shallow trench isolation (STI) features formed in the substrate 54, defining various active regions. In the present embodiment, the STI features define active regions for respective unit pixels (such as 54A, 54B and 54C) and each unit pixel includes a photosensitive device.

The photosensitive structure 52 includes various devices, such as field effect transistors (FETs) formed in the substrate 56 and configured to form read-out circuits 60.

The photosensitive structure 52 also includes an interconnect structure 62 configured to couple various devices (including the photosensitive devices and read-out circuits) to form a functional circuit. The interconnect structure 62 includes an inter-layer dielectric (ILD) layer disposed on the substrate 56, a plurality of inter-metal dielectric (IMD) layers, and various interconnect features formed in the ILD layer and the IMD layers. The interconnect features are conductive features and are distributed in various metal layers. The interconnect features include contact features, via features and metal lines. Particularly, the contact features are configured between metal one and the semiconductor substrate, coupling the metal one and semiconductor substrate. The via features are configured between adjacent metal layers, coupling adjacent metal layers. The metal lines provide horizontal routings in respective metal layers. In one embodiment, the interconnect features include copper and are formed using damascene technology. The interconnect features may include other conductive materials, such as copper alloy, titanium, titanium nitride, tantalum, tantalum nitride, tungsten, polysilicon, metal silicide, or combinations thereof. In one embodiment, silicide may be formed on the gate and/or source/drain for reduced contact resistance. In another embodiment, aluminum is used for interconnect with aluminum technology known in the art. For example, the aluminum alloy including copper and silicon may be used to form interconnect features. In this case, a metal etching process may be used to form metal lines. In another embodiment, tungsten may be used to form tungsten plugs for various contact features and via features with better filling effect.

The photosensitive structure 52 includes a plurality of photosensitive devices 64 disposed on the interconnect structure 62, such as various photosensitive devices 62 formed within respective active regions 54. The photosensitive devices 64 include pixel electrodes 32, a photoelectrical conversion layer 66 and a transparent electrode 44.

Each photosensitive device 64 includes a pixel electrode 32 patterned and configured to be coupled with respective read-out circuit 60. In one example, the pixel electrode 32 includes a conductive material, such as titanium (Ti), titanium nitride (TiN), gold (Au), silver (Ag) or aluminum (Al). The deposition of the electrode 32 may include PVD, plating or other suitable deposition technique.

The transparent electrode 44 is disposed on the photoelectrical conversion layer 66. The transparent electrode 44 includes a conductive material that is transparent to the light to be sensed by the photosensitive device 30 during the applications. In one example, the transparent electrode 44 includes ITO. In other example, the transparent electrode 44 includes aluminum-doped zinc oxide (AZO) or indium gallium zinc oxide (IGZO). The deposition of the transparent electrode may include PVD, pulsed laser deposition or other suitable deposition technique.

The photoelectrical conversion layer 66 includes various material layers (of the photosensitive device) sandwiched between the transparent electrode 44 and the pixel electrode 32. For example, the photoelectrical conversion layer 66 includes various layers 34, 36, 38, 40 and 42 of the photosensitive device 30.

Figure 11:
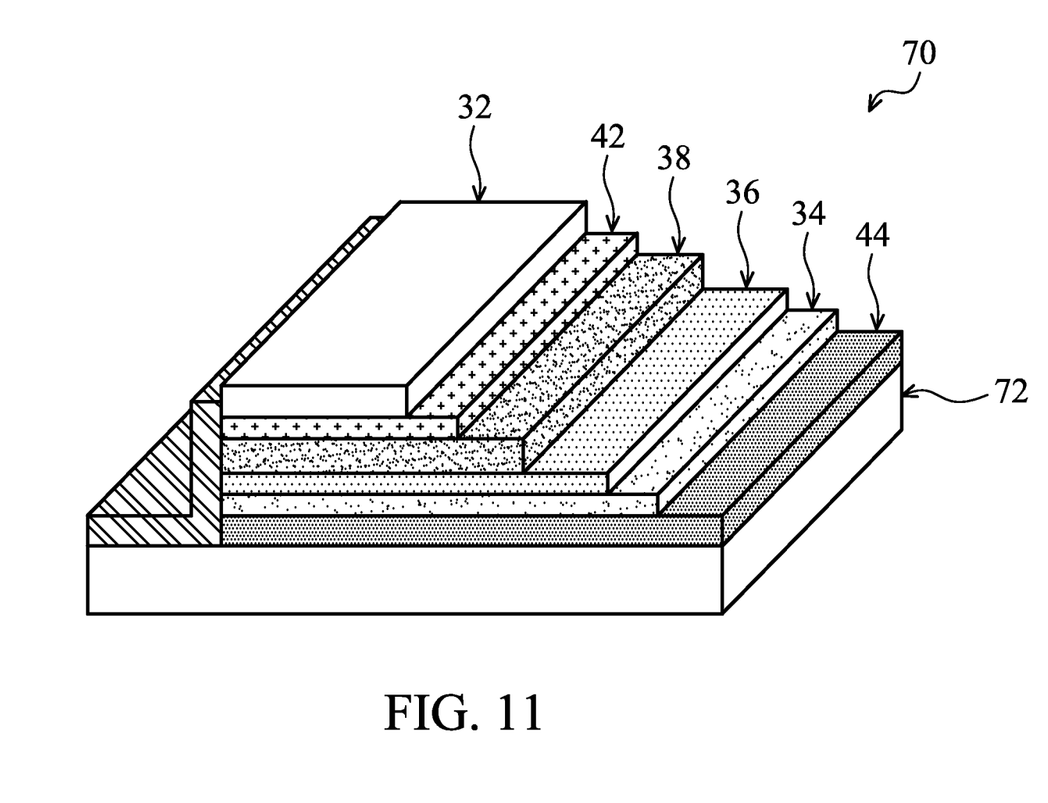
FIG. 11 illustrates a perspective view of a photosensitive structure constructed according to aspects of the present disclosure in another embodiment.

FIG. 11 illustrates a perspective view of a photosensitive device 70 constructed according to aspects of the present disclosure in other embodiments. The photosensitive device 70 may be one example of the photosensitive device 30. The photosensitive device 70 includes an electron blocking layer inserted between the hole transport layer and the organic photoactive layer.

Particularly, the photosensitive device 70 includes a substrate 72, such as a glass substrate or other suitable substrate. The photosensitive device 70 is formed on the substrate 72. The electrodes may be formed by PVD or other suitable technique. Various organic material layers may be formed by a suitable technique, such as spin coating, knife-over-edge coating, spray coating, slot-die coating, rotogravure printing, thermal evaporated process or screen printing.

The photosensitive device 70 includes a transparent electrode 44 disposed on the substrate 72. The transparent electrode 44 includes a conductive material that is transparent to the light to be sensed by the photosensitive device 70 during the applications. In one embodiment, the transparent electrode 44 includes ITO. In other embodiment, the transparent electrode 44 includes AZO or IGZO. The deposition of the transparent electrode may include PVD, pulsed laser deposition or other suitable deposition technique.

The photosensitive device 70 includes a hole transport and electron blocking layer 34 disposed on the transparent electrode 44. In one embodiment, the hole transport and electron blocking layer 34 includes PEDOT:PSS. In an example, the thickness of the PEDOT:PSS ranges between about 30 nm and about 40 nm. In an alternative embodiment, the hole transport and electron blocking layer 34 includes one $MoO_3$, NiO, CuO, $V_2O_5$ and a combination thereof.

The photosensitive device 70 includes an organic hole transport and electron blocking layer 36 disposed on the hole transport and electron blocking layer 34. In one embodiment, the organic hole transport and electron blocking layer 36 includes P3HT. In one example, P3HT may be formed various suitable conditions that include mixing with additive, coating and annealing. The annealing is implemented in an annealing temperature ranging from about 130° C. and about 170° C. for a duration ranging from about 10 minutes to about 30 minutes.

The photosensitive device 70 includes an organic photoactive layer 38 disposed on the organic hole transport and electron blocking layer 36. In the present embodiment, the organic photoactive layer 38 includes a mixture of a conjugated polymer and a fullerene derivative. In one example, the organic photoactive layer 38 includes a blending of P3HT and PCBM. In furtherance of the example, the thickness ranges between about 120 nm and about 150 nm. The ratio of P3HT and PCBM is about 1:0.8 in molecular weight. In another example, the organic photoactive layer 38 includes a blending of PTB7:PC70BM. In furtherance of the example, the ratio of PTB7 and PC70BM is about 1:1.5 in molecular weight.

In other example, the organic photoactive layer 38 includes a blend of PTB7:PC71BM. In another embodiment, the organic photoactive layer 38 includes a combination of PCBM, PC71BM, PC70BM, P3HT, PTB7, or a subset thereof.

The photosensitive device 70 includes an electron transport and hole blocking layer 42 disposed on the organic photoactive layer 38. The electron transport and hole blocking layer 42 includes LiF, titanium oxide ($TiO_2$), zinc oxide (ZnO), tantalum oxide ($Ta_2O_5$), zirconium oxide ($ZrO_2$) or a combination thereof. The formation of the electron transport and hole blocking layer 34 may include PVD, chemical vapor deposition (CVD) or other suitable deposition technique. In one particular example, the electron transport and hole blocking layer 42 of LiF has a thickness ranging between about 0.8 nm and about 1 nm. The electron transport and hole blocking layer 42 of LiF may be formed by PVD with a deposition rate of about 0.2 A/s.

The photosensitive device 70 includes an electrode 32 disposed on the electron transport and hole blocking layer 42. The electrode 32 includes a conductive material, such as titanium (Ti), titanium nitride (TiN), gold (Au), silver (Ag) or aluminum (Al). The deposition of the electrode 32 may include PVD, plating or other suitable deposition technique. In one particular example, the electrode 32 of Al has a thickness of about 100 nm and is formed by PVD with a deposition rate of about 3 A/s.

Different advantages may present in various embodiments. In one embodiment, P3HT is inserted between the hole transport layer and the photoactive layer. In one example, P3HT has a high-molecular weight with a weight-average molecular weight (Mw) of 30000~60000 g/mol and a polydispersity index less than about 1.5.

In other examples, various parameters are improved by inserting a P3HT layer, as described below. The dark current density of the photosensitive device is reduced to less than 10% of a photosensitive device without the inserting layer P3HT. The short-circuit current density is increased by 10~20% relative to that of a photosensitive device without the P3HT layer. The power conversion efficiency is increased by 10~20% relative to that of a photosensitive device without the P3HT layer.

Particularly, P3HT absorbs light with 400-600 nm in wavelength and creates an extra donor/acceptor interface to enhance short circuit current density. P3HT layer substantially increases the blocking electron capability to reduce dark current density.

Thus, the present disclosure provides a photosensitive structure. The photosensitive structure includes a donor-intermix-acceptor (PIN) structure. The PIN structure further includes an organic hole transport layer; an organic electron transport layer; and an intermix layer sandwiched between the hole transport organic material layer and the electron transport organic material layer. The intermix layer includes a mixture of an n-type organic material and a p-type organic material.

In one embodiment of the photosensitive structure, the intermix layer includes a mixture of an n-type fullerene derivative and a p-type conjugated polymer. In another embodiment, the organic hole transport layer includes an organic p-type material; the organic electron transport layer includes an organic n-type material; and the intermix layer includes a mixture of the organic n-type material and the organic p-type material.

In another embodiment, the organic electron transport layer includes Phenyl-C61-Butyric-Acid-Methyl Ester (PCBM). In another embodiment, the organic hole transport layer includes Poly(3-hexylthiophene-2,5-diyl) (P3HT) or Poly(2-methoxy-5-(3'-7'-dimethyloctyloxy)-1,4-phenylenevinylene (MDMO-PVV).

In another embodiment, the intermix layer includes a mixture of P3HT and PCBM (P3HT:PCBM) or a mixture of Poly[[4,8-bis[(2-ethylhexyl)oxy]benzo[1,2-b:4,5-b']dithiophene-2,6-diyl] [3-fluoro-2-[(2-ethylhexyl)carbonyl] thieno[3,4-b]thiophenediyl]] (PTB7) and phenyl-C70-butyric acid methyl ester (PC70BM).

In yet another embodiment, the organic hole transport layer includes P3HT; the organic electron transport layer includes PCBM; and the intermix layer includes a mixture of P3HT and PCBM.

The photosensitive structure may further include a hole transport layer configured such that the organic hole transport layer is disposed between the hole transport layer and the intermix layer. In one embodiment, wherein the hole transport layer includes poly(3,4-ethylenedioxythiophene) poly(styrenesulfonate) (PEDOT:PSS). In another embodiment, the hole transport layer includes one of molybdenum oxide ($MoO_3$), nickel oxide (NiO), copper oxide (CuO), vanadium oxide ($V_2O_5$) and a combination thereof.

The photosensitive structure may further include an electron transport layer configured such that the organic electron transport layer is disposed between the electron transport layer and the intermix layer. In one embodiment, the electron transport layer includes one of lithium fluorine (LiF), titanium oxide ($TiO_2$), zinc oxide (ZnO), tantalum oxide ($Ta_2O_5$), zirconium oxide ($ZrO_2$) or a combination thereof.

The present disclosure also provides a photosensitive structure in another embodiment. The photosensitive structure includes a hole transport layer; an organic photoactive layer; and an organic electron blocking layer sandwiched between the hole transport layer and the organic photoactive layer. The organic photoactive layer includes a mixture of a fullerene derivative and a conjugated polymer.

In one embodiment, the organic photoactive layer includes a mixture of Poly(3-hexylthiophene-2,5-diyl) (P3HT) and Phenyl-C61-Butyric-Acid-Methyl Ester (PCBM).

In another embodiment, the organic photoactive layer includes a mixture of Poly[[4,8-bis[(2-ethylhexyl)oxy]benzo[1,2-b:4,5-b']dithiophene-2,6-diyl] [3-fluoro-2-[(2-ethylhexyl)carbonyl] thieno[3,4-b]thiophenediyl]] (PTB7) and phenyl-C70-butyric acid methyl ester (PC70BM).

In yet another embodiment, the organic electron blocking layer includes an organic material selected from the group consisting of Poly(3-hexylthiophene-2,5-diyl) (P3HT), and Poly(2-methoxy-5-(3'-7'-dimethyloctyloxy)-1,4-phenylenevinylene (MDMO-PVV).

In yet another embodiment, the hole transport layer includes poly(3,4-ethylenedioxythiophene) poly(styrenesulfonate) (PEDOT:PSS).

In yet another embodiment, the photosensitive structure further includes an n-type fullerene derivative configured such that the organic photoactive layer is disposed between the n-type fullerene derivative and the organic electron blocking layer, wherein the n-type fullerene derivative includes PCBM.

In yet another embodiment, the photosensitive structure further includes an electron transport layer configured such that the n-type fullerene derivative is disposed between the electron transport layer and the organic photoactive layer, wherein the electron transport layer includes one of lithium fluorine (LiF), titanium oxide ($TiO_2$), zinc oxide (ZnO), tantalum oxide ($Ta_2O_5$), zirconium oxide ($ZrO_2$) or a combination thereof.

The present disclosure also provides another embodiment of a photosensitive structure. The photosensitive structure includes a hole transport layer; an organic hole transport layer disposed on the hole transport layer; an organic photoactive layer disposed on the organic hole transport layer; an organic electron transport layer disposed on the organic photoactive layer; and an electron transport layer disposed on the organic electron transport layer.

In one embodiment, the hole transport layer includes poly(3,4-ethylenedioxythiophene) poly(styrenesulfonate) (PEDOT:PSS); the organic hole transport layer includes one of Poly(3-hexylthiophene-2,5-diyl) (P3HT) and Poly(2-methoxy-5-(3'-7'-dimethyloctyloxy)-1,4-phenylenevinylene (MDMO-PVV); the organic electron transport layer includes Phenyl-C61-Butyric-Acid-Methyl Ester (PCBM); the organic photoactive layer includes P3HT:PCBM; and the electron transport layer includes one of lithium fluorine (LiF), titanium oxide ($TiO_2$), zinc oxide (ZnO), tantalum oxide ($Ta_2O_5$), zirconium oxide ($ZrO_2$) or a combination thereof.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A photosensitive structure, comprising:
    a donor-intermix-acceptor (PIN) structure that includes:
    a hole transport layer;
    an organic poly(3-hexylthiophene-2,5-diyl) (P3HT) hole transport layer disposed on the hole transport layer, wherein the organic P3HT hole transport layer has a larger bandgap than the hole transport layer;
    an intermix layer disposed on the organic P3HT hole transport layer, wherein the intermix layer includes a mixture of P3HT and phenyl-C61-butyric-acid-methyl ester (PCBM);
    a lithium fluorine (LiF) electron transport layer disposed over the intermix layer, wherein the intermix layer has a gradient composition that varies from the organic P3HT hole transport layer to the LiF electron transport layer, and further wherein the intermix layer has textured surfaces that interface with the organic P3HT hole transport layer and the LiF electron transport layer; and
    an electrode disposed on the LiF electron transport layer.

2. The photosensitive structure of claim 1, wherein the organic P3HT hole transport layer has:
    a highest occupied molecular orbital (HOMO) ranging between 5 eV and 5.4 eV,
    a lowest unoccupied molecular orbital (LUMO) ranging between 2.8 eV and 3.2 eV, and
    a bandgap ranging between 2 eV and 2.4 eV.

3. The photosensitive structure of claim 1, wherein the hole transport layer includes one of: molybdenum oxide ($MoO_3$), nickel oxide (NiO), copper oxide (CuO), vanadium oxide ($V_2O_5$), tungsten oxide ($WO_3$) or a combination thereof.

4. The photosensitive structure of claim 1, wherein the hole transport layer includes poly(3,4-ethylenedioxythiophene) poly(styrenesulfonate) (PEDOT:PSS).

5. The photosensitive structure of claim 1, wherein the hole transport layer is disposed on a first electrode that includes indium tin oxide (ITO), and the electrode is a second electrode that includes aluminum (Al).

6. The photosensitive structure of claim 1, wherein a ratio of a molecular weight of the P3HT to the PCBM is about 1:0.8.

7. A photosensitive structure, comprising:
- a poly(3,4-ethylenedioxythiophene) poly(styrenesulfonate) (PEDOT:PSS) hole transport layer disposed on a first electrode;
- an organic poly(3-hexylthiophene-2,5-diyl) (P3HT) electron blocking layer disposed on the PEDOT:PSS hole transport layer;
- an organic photoactive layer disposed on the organic P3HT electron blocking layer, wherein the organic photoactive layer includes a mixture of P3HT and phenyl-C61-butyric-acid-methyl ester (PCBM), wherein a ratio of a molecular weight of the P3HT to the PCBM is about 1:0.8;
- a lithium fluorine (LiF) hole blocking layer disposed over the organic photoactive layer; and
- a second electrode disposed on the LiF hole blocking layer.

8. The photosensitive structure of claim 7, wherein the LiF hole blocking layer is disposed on the organic photoactive layer.

9. The photosensitive structure of claim 7, further comprising an organic hole blocking layer disposed between the organic photoactive layer and the LiF hole blocking layer.

10. The photosensitive structure of claim 7, wherein the first electrode includes indium tin oxide and the second electrode includes aluminum.

11. The photosensitive structure of claim 9, wherein the organic hole blocking layer includes a material that has:
- a highest occupied molecular orbital (HOMO) ranging between 6.1 eV and 6.7 eV,
- a lowest unoccupied molecular orbital (LUMO) ranging between 3.2 eV and 4.5 eV, and
- a bandgap ranging between 1.6 eV and 3.0 eV.

12. The photosensitive structure of claim 9, wherein the organic hole blocking layer includes a material in common with the organic photoactive layer.

13. The photosensitive structure of claim 7, wherein the organic photoactive layer has textured surfaces that interface with the organic P3HT electron blocking layer and the LiF hole blocking layer.

14. The photosensitive structure of claim 9, wherein the organic photoactive layer has textured surfaces that interface with the organic P3HT electron blocking layer and the organic hole blocking layer.

15. The photosensitive structure of claim 14, wherein the organic hole blocking layer includes phenyl-C61-butyric-acid-methyl ester (PCBM).

16. The photosensitive structure of claim 7, wherein the organic photoactive layer has a gradient composition that varies from the organic P3HT electron blocking layer to the LiF hole blocking layer.

17. A photosensitive structure, comprising:
- a poly(3,4-ethylenedioxythiophene) poly(styrenesulfonate) (PEDOT:PSS) hole transport layer disposed on a first electrode;
- an organic poly(3-hexylthiophene-2,5-diyl) (P3HT) hole transport layer disposed on the PEDOT:PSS hole transport layer, wherein a material of the organic P3HT hole transport layer has a larger bandgap than a material of the PEDOT:PSS hole transport layer;
- an organic photoactive layer disposed on the organic P3HT hole transport layer, wherein the organic photoactive layer includes a mixture of poly (PTB7) and phenyl-C70-butyric acid methyl ester (PC70BM);
- a lithium fluorine (LiF) electron transport layer disposed over the organic photoactive layer, wherein the organic photoactive layer has a gradient composition that varies from the organic P3HT hole transport layer to the LiF electron transport layer; and
- a second electrode disposed on the LiF electron transport layer.

18. The photosensitive structure of claim 17, further comprising an organic phenyl-C61-butyric-acid-methyl ester (PCBM) electron transport layer disposed between the organic photoactive layer and the LiF electron transport layer.

19. The photosensitive structure of claim 18, wherein the organic photoactive layer has textured surfaces that interface with the organic P3HT hole transport layer and the organic PCBM electron transport layer.

20. The photosensitive structure of claim 17, wherein the organic photoactive layer has textured surfaces that interface with the organic P3HT hole transport layer and the LiF electron transport layer.

* * * * *